United States Patent
Vulih et al.

[11] Patent Number: 5,892,375
[45] Date of Patent: Apr. 6, 1999

[54] COMPARATOR WITH SMALL SIGNAL SUPPRESSION CIRCUITRY

[75] Inventors: Salomon Vulih, Neshanic St.; Stephen J. Glica, Somerset; Harold Allen Wittlinger, Pennington, all of N.J.

[73] Assignee: Harris Corporation, Melbourne, Fla.

[21] Appl. No.: 918,345

[22] Filed: Aug. 26, 1997

[51] Int. Cl.⁶ ........................... H03K 5/22
[52] U.S. Cl. ........................ 327/65; 327/79; 330/9
[58] Field of Search ..................... 327/63, 65, 67, 327/77, 307, 337, 554, 560–563, 78, 79; 330/9, 51

[56] References Cited

U.S. PATENT DOCUMENTS

| | | | |
|---|---|---|---|
| 4,988,900 | 1/1991 | Fensch | 327/554 |
| 5,493,246 | 2/1996 | Anderson | 327/307 |
| 5,525,920 | 6/1996 | Rakers et al. | 327/65 |
| 5,680,072 | 10/1997 | Vulih et al. | 330/9 |
| 5,736,895 | 4/1998 | Yu et al. | 327/554 |

*Primary Examiner*—Toan Tran
*Attorney, Agent, or Firm*—Henry I. Schanzer

[57] ABSTRACT

A comparator circuit has first and second inputs and an output and includes means for operating the comparator in alternate autozero and comparator phases. During an autozero phase, the inputs of the comparator are clamped to a reference potential and during a compare phase, input signals are applied to the input of the comparator. Control signals are applied to the inputs of the comparator during a portion of the compare phase. The control signals determine the state of the comparator output when the input signals applied to the inputs of the comparator are below a predetermined level.

21 Claims, 4 Drawing Sheets

COMPARATOR WITH SMALL SIGNAL SUPPRESSION CIRCUITRY

BACKGROUND OF THE INVENTION

This invention relates to amplifier and comparator circuitry and, in particular, to amplifier and comparator circuitry including circuitry for suppressing small, noise-like, input signals.

A problem which exists in the art and which is solved by the present invention may be best explained with reference to FIG. 1 which shows a system designed to sense the "knock" of an engine and means for generating signals to correct for the knock. A knock sensor 10, which may generally be a microphone and which is located on or near an automobile engine, produces a knock signal (ek) in response to the "knocking" of the engine. The signal (ek) is then applied to an amplifier 12 whose output is applied to the input of an anti-aliasing filter 13 whose output is applied to the input of a programmable gain stage 14. In response to the knock signal ek the programmable gain stage 14 produces at its output an in-phase signal (ek1) and an out-of-phase signal (ek1b). The signal ek1 is applied to a bandpass filter 16a and the signal ek1b is applied to a bandpass filter 16b. The output of filter 16a produces a signal identified as $V_{IN}$ and the output of filter 16b produces a signal identified as $V_{INB}$. Theoretically, in-phase signal $V_{IN}$ should be the exact complement (or inverse) of the out-of-phase signal $V_{INB}$. Input signals $V_{IN}$ and $V_{INB}$ are then applied to a rectifier section 18 which controls the application of the signals $V_{IN}$ and $V_{INB}$ to an integrator 20. Integrator 20 includes a positive signal integrator 20a and a negative signal integrator 20b. The rectifying circuit 18 includes circuitry for comparing $V_{IN}$ and $V_{INB}$ and switches for enabling the positive going portion of signals $V_{IN}$ and $V_{INB}$ to be applied to integrator 20a and the negative going portion of signals $V_{IN}$ and $V_{INB}$ to be applied to integrator 20b. As a result, the outputs of integrators 20a and 20b function to increase the positive and negative amplitude of the knock signal over selected integrating intervals.

The outputs of integrators 20a and 20b are fed to a differential to single-ended amplifier whose output charges a storage capacitor C24 whose potential is used to drive a buffer 26 whose output is then used to control (reduce) the engine knock.

A problem exists when there is no knock signal (e.g., the knock sensor is disconnected) or when the knock signal is very small. It is virtually impossible to manufacture programmable gain stage (e.g., 14) such that the circuit sections producing the in-phase and out-of-phase signals and their filters (e.g., 16a, 16b) are totally identical. No matter how carefully the circuit and its components are made, there are differences (albeit small) in the components and their lay out. Consequently, when the knock signal (ek) is very small or non-existent, a net difference or offset will nevertheless exist between $V_{IN}$ and $V_{INB}$. Although the difference and offset may be small, a significant error may result. This is because the outputs of the bandpass filters (16a, 16b) are fed to a rectifier section 18 to control the application of $V_{IN}$ and $V_{INB}$ to integrators 20a and 20b. The difference between $V_{IN}$ and $V_{INB}$ due to noise and offsets produces a "false" signal which increases in time, magnifying the effect of the false signal.

It is an object of this invention to reduce or eliminate the effect of "low level" and "offset" signals which tend to provide a false indication of the input signal.

SUMMARY OF THE INVENTION

According to one aspect of the invention, input signals applied to the input of a comparator which are below a predetermined level are effectively "suppressed". Suppression is accomplished by applying control signals of predetermined amplitude and frequency to the input of the comparator which override any input signals of lower amplitude and cause the output of the comparator to vary alternatively about a reference level at a frequency determined by the control signals.

In one embodiment of the invention, first and second input signals respectively applied to the first and second inputs of a comparator produce at its output an output signal having a first value when the signal applied to its first input is more positive than the signal applied to its second input and produce an output signal having a second value when the signal applied to its second input is more positive than the signal applied to its first input. A first control signal is applied to the first comparator input and a second control signal is applied to the second comparator input whereby the net signal at the first input is a function of the first input signal and the first control signal and the net signal at the second input is a function of the second input signal and the second control signal. The first control signal varies at a first rate between first and second levels and the second control signal is the complement of the first control signal. The amplitude of the control signals is selected such that for values of input signals below a predetermined level, the control signals determine the nature and value of the signals produced at the output of the comparator.

In a particular embodiment of the invention, the first and second input signals are applied to the first and second inputs of the comparator via respective first and second capacitors and the first control signal is applied to the first comparator input via a third capacitor and the second input signal is applied to the second comparator input via a fourth capacitor.

In a particular embodiment of the invention selectively enabled clamping switches couple the first and second capacitor inputs to points of reference potential for selectively and periodically clamping the comparator inputs to the reference potential. The first and second control signals which are preferably complementary square signals are timed to make transitions from high-to-low and from low-to-high when the clamping switches are disabled.

In one embodiment of the invention, a comparator circuit has first and second inputs and an output and includes means for operating the comparator in alternate autozero and comparator phases. During an autozero phase, the inputs of the comparator are clamped to a reference potential and during a compare phase, input signals are applied to the input of the comparator. Control signals are applied to the inputs of the comparator during a portion of the compare phase. The control signals determine the state of the comparator output when the input signals applied to the inputs of the comparator are below a predetermined level.

BRIEF DESCRIPTION OF THE DRAWINGS

In the accompanying drawings like reference characters denote like components.

DETAILED DESCRIPTION OF THE INVENTION

Figure 1:
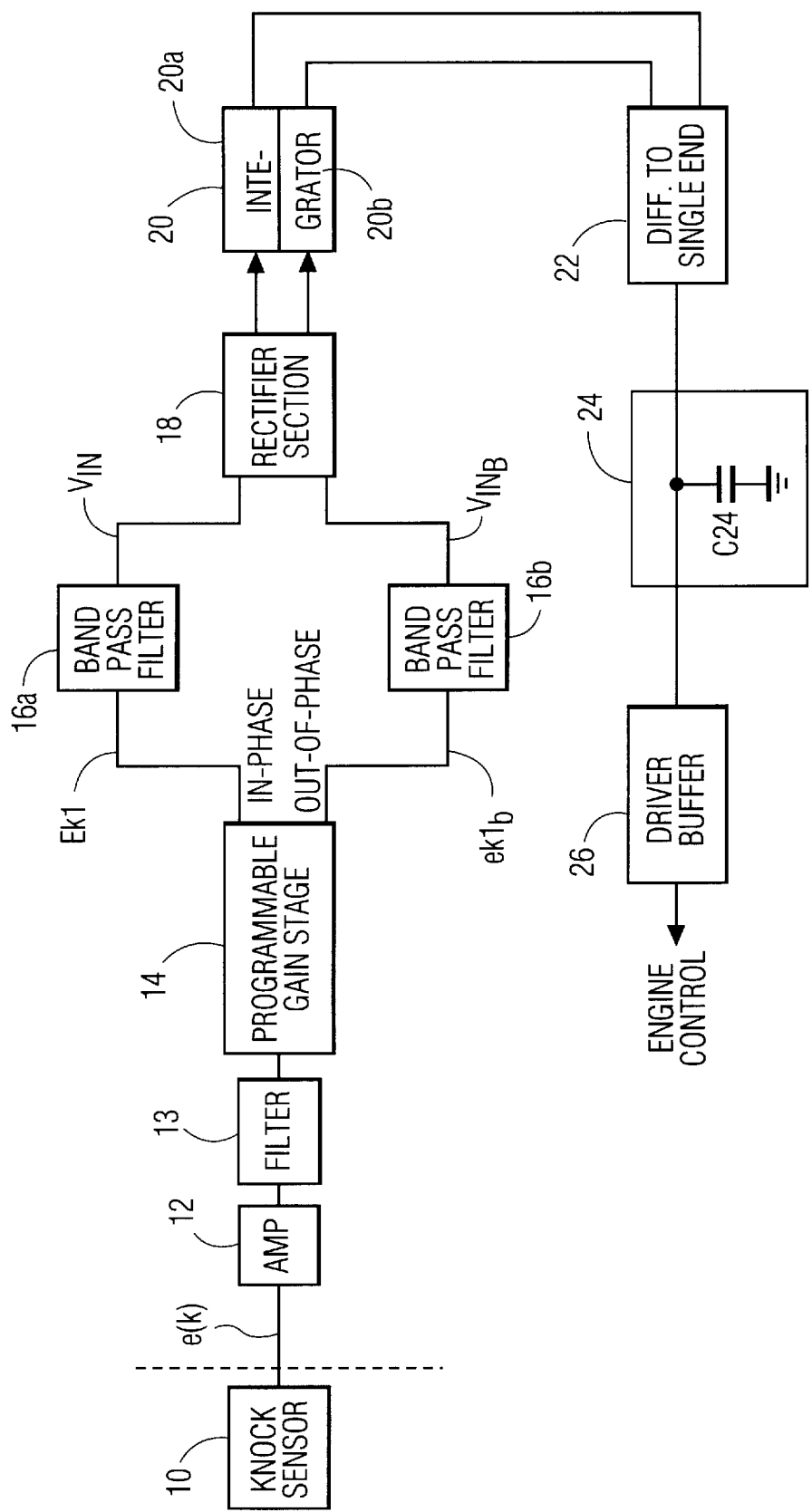
FIG. 1 is a block diagram of a prior art system.
Figure 2:
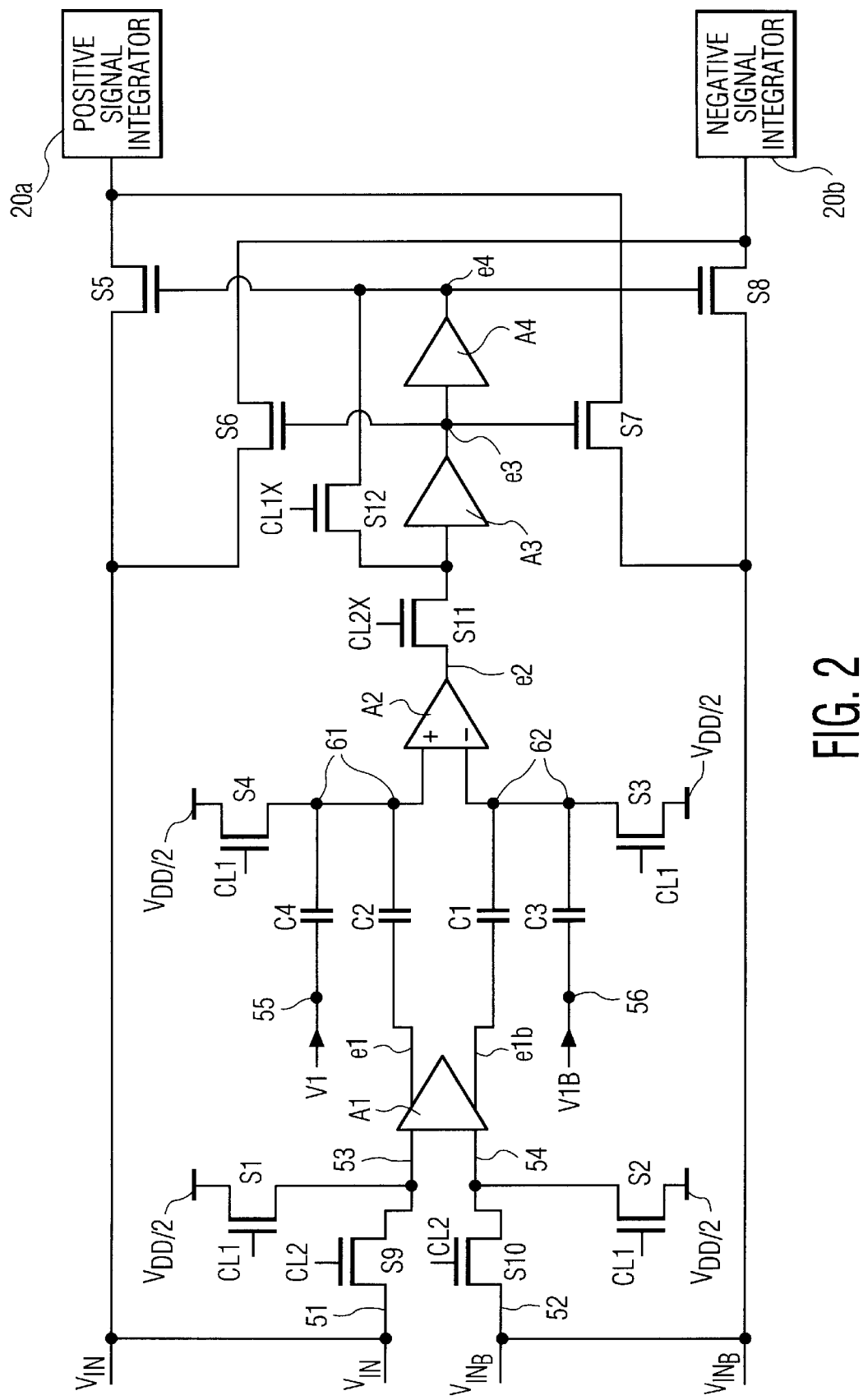
FIG. 2 is a schematic diagram of a circuit embodying the invention for use in the system of FIG.1.

The circuit of FIG. 2 illustrates a portion of the rectifier section 18 embodying the invention. An in-phase signal $V_{IN}$ (See FIG. 1) is applied to an input terminal 51 and a signal $V_{INB}$ (See FIG. 1) which is the complement of $V_{IN}$ (180° out-of-phase thereto) is applied to input terminal 52. The signal $V_{IN}$ is applied via a switch S9 to one input 53 of an amplifier A1 and the signal $V_{INB}$ is applied via a switch S10 to another input 54 of amplifier A1. A selectively enabled switch S1 is connected between the one input (53) of amplifier A1 and a reference potential (e.g., VDD/2), and a selectively enabled switch S2 is connected between the other input (54) of amplifier A1 and the reference potential (e.g., VDD/2). Amplifier A1 has an in-phase output e1 and an out-of-phase output e1b. The signal e1 is coupled via a capacitor C2 to a node 61 to which is connected the positive input terminal of an amplifier A2, which is designed to function as a comparator. The signal e1b is coupled via a capacitor C1 to a node 62 to which is connected the negative input terminal of amplifier A2. Normally, capacitors C1 and C2 are designed to have the same values.

Figure 3:
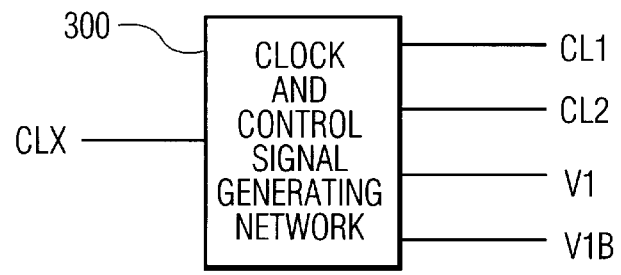
FIG. 3 is a block diagram of a network for producing control signals for use in the circuit of FIG. 2.

The small (noise) signal suppression and cancelling circuit embodying the invention includes: (a) a capacitor C4 connected between a terminal 55 and node 61 and a capacitor C3 connected between a terminal 56 and node 62; (b) circuitry responsive to a clock signal CLx for generating a control voltage V1 and its complement (or inverse) V1B, as shown in FIG. 3; and (c) circuit means for applying the voltage V1 to terminal 55 and the voltage V1B to terminal 56. Normally, capacitors C3 and C4 are designed to have the same values. Capacitors C1 and C3 form a first capacitive divider network and capacitors C2 and C4 form a second capacitive divider network, which function as described below.

A selectively enabled switch S3 is connected between node 62 and the reference potential (e.g., VDD/2), and a selectively enabled switch S4 is connected between node 61 and the reference potential (e.g, VDD/2). Amplifier A2 compares the signal, e61, produced at node 61, with the signal, e62, produced at node 62, and produces an output signal e2 which is applied via switch S11 to the input of a latch circuit comprised of inverters A3 and A4 and switch S12.

Inverter A3 responds to the signal e2 and produces an inverted output e3 which is applied to the input of inverter A4. Inverter A4 responds to the signal e3 and produces an inverted output e4 which is fed back to the input of inverter A3 via switch S12, when switch S12 is closed. When S12 is closed, inverters A3 and A4 are cross coupled and function as a latch.

When switch S12 is open, switch S11 is closed coupling the output e2 of comparator amplifier A2 to the input of inverter A3. Subsequently, when S11 opens and S12 closes, the latch circuit (A3, A4) stores a state indicative of the condition of e2 at the time S12 closes (and S11 opens). By way of example, if the output e2 of amplifier A2 is above a certain level (e.g., above VDD/2), e3 goes low (ground) and e4 goes high (e.g., VDD). When S12 closes, these conditions will be maintained (stored) by cross-coupled inverters A3 and A4, so long as S12 remains closed. If, on the other hand, e2 of amplifier A2 is below the certain level (e.g., below VDD/2), then e3 goes high (e.g., VDD) and e4 goes low (e.g., ground). When S12 closes, these conditions will be maintained (stored) by the latch (A3 and A4), so long as S12 remains closed.

The latch has two outputs, e3 and e4, which are complementary to each other. The output e3 of A3 is used to control the turn-on and turn-off of switches S6 and S7 and the output e4 of A4 is used to control the turn-on and turn-off of switches S5 and S8. For purpose of illustration, when e3 is high and e4 is low, switches S6 and S7, which are controlled by e3, are closed, and switches S5 and S8, which are controlled by e4, are open. Alternatively, when e3 is low and e4 is high, switches S6 and S7 are opened and switches S5 and S8 are closed.

When switches S5 and S8 are turned-on (switches S6 and S7 are turned-off), the input signal $V_{IN}$ is applied to positive signal integrator 20a via S5, and input $V_{INB}$ is applied to negative signal integrator 20b via S8. When switches S6 and S7 are turned-on (switches S5 and S8 are turned-off), the input signal $V_{IN}$ is applied to integrator 20b via S6 and the input signal $V_{INB}$ is applied to integrator 20a via S7.

The operation of the circuit and, in particular, that portion pertaining to the invention will now be discussed in greater detail.

For ease of explanation in the discussion to follow, assume that switches S1 through S12 are MOS transistors of N conductivity type. That is, each one of these "switching" transistors is turned-on (i.e., switch-closed) when a "high" voltage is applied to its gate electrode and each one of the switching transistors is turned-off (i.e., switch-open) when a "low" voltage is applied to its gate electrode.

It should be understood that the switches could instead be a mixture of N and P type MOS transistors or that each switch could comprise a pair of complementary MOS transistors (i.e., an N and a P type MOS transistor with their conduction paths connected in parallel).

Figure 4:
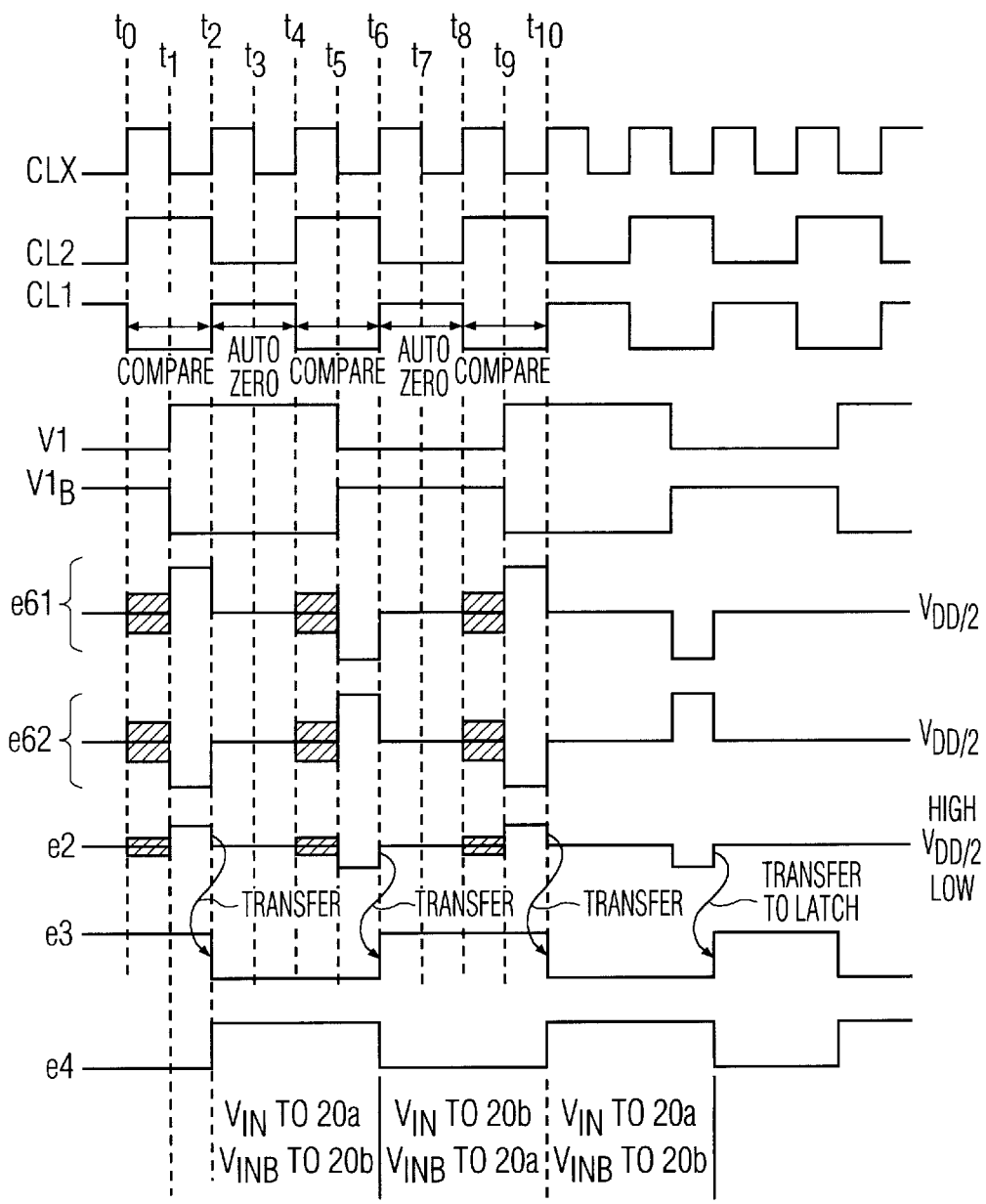
FIG. 4 is a waveform diagram of input and control signals and of the output signals at selected nodes of the circuits of FIGS. 2 and 3.

The circuit of FIG. 2 may be operated by a control clock signal (CL1) and its complement (CL2) and a control voltage (V1) and its complement (VIB) which are produced by clock shaping network 300, shown in FIG. 3. A clock signal CLx is applied to clock shaping network 300 which is designed to produce: (a) a first control clock signal, CL1 and a second control clock signal, CL2, which is the inverse or complement of CL1; and (b) a first control signal V1 and a second control signal V1B which is the complement, or inverse, of V1. V1 is a square wave whose rate (frequency) is related to the rate at which the switches S1, S2, S3 and S4 are opened and closed. V1 varies between fixed voltage levels (e.g., VDD and ground, though different levels may be used). For appropriate operation, the clocking and control signals need to be appropriately phased. One arrangement of CLx, CL1, CL2, V1 and V1B is shown in FIG. 4.

The first and second control signals (V1 and V1B) are designed to vary at one half the rate of clock signal CL1 (or CL2). For the particular embodiment of FIG. 27 V1 and V1B are designed to go from low-to-high and high-to-low when CL1 is low, i.e., when switches S3 and S4 are open). By way of example, note that V1 goes from low-to-high when CL1 is low and before CL1 goes from low-to-high, and that V1 goes from high-to-low after CL1 has gone from high-to-low and is low. Clock shaping network 300 may be any one of a number of circuits capable of producing the described signals and need not be detailed.

Referring back to FIG. 2, CL1 is applied to switches S1, S2, S3 and S4 and CL2 is applied so as to control the turn-on and turn-off of switches S9 and S10. V1 is applied via a capacitive divider network to an input of the comparator. V1B, which is the complement of V1, is also applied via a capacitive divider network to another input of the comparator. The amplitude of V1 (and V1B) is selected such that when it is applied to the capacitive network, it produces a desired voltage step at its corresponding input to the comparator A2. In practice, a clock signal CL1x, derived from CL1, is applied to and controls the turn-on and turn-off of S12 and the clock signal CL2x, derived from CL2, is applied to and controls the turn-on and turn-off of switch S11. The phasing of CL1x and CL2x is designed to ensure that the latch circuit (A3, A4) is in a latch condition (i.e., S12 closed) for most of the time. However, for ease of illustration in the discussion to follow, CL1x will be assumed to be like CL1 and CL2x will be assumed to be like CL2 Where the switches are N type MOS transistors, the clock signals are applied to the gate electrode of these transistors. Consequently, S1, S2, S3, S4 and S12 are closed (i.e., turned-on), at the same time, during the positive going portion of the CL1 signal. During this clock portion, S9, S10 and S11 are open. During the negative going portion of the CL1 signal, S1, S2, S3, S4 and S12 are open (i.e., turned-off) and S9, S10 and S11 are closed (i.e, turned-on).

When CL1 goes high, which defines the autozero phase of the comparator A2 and amplifier A1, switches S1, S2, S3 and S4 are closed causing the reference potential (e.g., VDD/2) to be applied to the inputs (53, 54) of amplifier A1 and to the inputs of amplifier A2. For ease of explanation, assume that when switches S1 and S2 are closed, the outputs e1 and e1$b$ of amplifier A1 are at, or close to, VDD/2 volts, where VDD and ground are the operating potentials applied to amplifier A1.

When CL1 goes low (CL2 goes high), which defines the compare phase of comparator A2 and amplifier A1, $V_{IN}$ is coupled via S9 to one input (53) of amplifier A1 and $V_{INB}$ is coupled via S10 to the other input (54) of amplifier A1. If $V_{IN}$ is positive relative to VDD/2, e1 will go positive relative to VDD/2 and e1$b$ will go negative relative to VDD/2. If $V_{IN}$ is negative relative to VDD/2, e1 will be, or go, negative relative to VDD/2 and e1$b$ will be, or go, positive relative to VDD/2.

The outputs (e1 and e1$b$) of amplifier A1 are coupled via capacitors C1 and C2 to the input nodes (61, 62) of comparator amplifier A2. In the absence of C3 and C4 and the application of control signals V1 and V1B, the signals produced at nodes 61 and 62 are solely a function of e1 and e1$b$. With capacitors C3 and C4 in the circuit and with V1 and V1B applied to these capacitors, the signals produced at nodes 61 and 62 are a function of e1 and V1 for node 61 and e1$b$ and V1B for node 62. If the signal at node 61 is more positive than the signal at node 62, the output e2 of A2 goes high (e.g., VDD volts). On the other hand, if the signal at node 61 is less positive than the signal at node 62, the output e2 goes low (e.g., ground). The output e2 is coupled via switch S11 (when S11 is on) to the input of inverter A3 of the latch circuit.

If the signal e2 is high, the output e3 of inverter A3 will be driven low and the output e4 of inverter A4 will be driven high. For this condition, switches S5 and S8 are turned-on and switches S6 and S7 are turned-off. The closure of switch S5 causes $V_{IN}$ to be applied to the input of positive signal integrator 20$a$ and the closure of switch S8 causes $V_{INB}$ to be applied to the input of negative signal integrator 20$b$.

If e2 is low, e3 will be driven high and e4 will be driven low. For this condition, switches S6 and S7 are turned-on (closed) and switches S5 and S8 are open. The closure of switches S6 and S7 causes $V_{IN}$ to be applied to the input of integrator 20$b$ and $V_{INB}$ to be applied to the input of integrator 20$a$. Thus, the outputs of the latch control which one of the input signals $V_{IN}$ and $V_{INB}$ are applied to the integrators 20$a$ and 20$b$.

As discussed above with respect to FIG. 1, a problem arises if the knock sensor is disconnected and/or when the input signals are very low. For these conditions, there should be virtually no net output from the integrators and no signals should be applied via the buffer driver 26 to the engine control (See FIG. 1). However, when there is no knock signal and/or the input signal is very low, due to various offsets and/or differences in the components or their layouts, a condition may exist where e1 may be constantly greater than e1$b$ or e1$b$ may be constantly greater than e1. As a result, one pair of rectifier switches (e.g., S5, S8) may be closed for a long period of time and the other pair (e.g., S6, S7) may be opened for that period of time. Consequently, the outputs of integrators 20$a$ and 20$b$ will indicate the presence of an ever increasing knock signal when such signal does not actually exist.

Applicant's invention is designed to ensure that when the knock signal, as represented by $V_{IN}$ and $V_{INB}$, is below a certain level, indicative of little or no knock error, the outputs of integrators 20$a$ and 20$b$ are, on the average, at or close to zero. As detailed below, this is accomplished by turning the rectifier switches (S5, S6, S7 and S8) on and off alternatively. That is, for one portion of a clock cycle, switches S5 and S8 are closed and switches S6 and S7 are opened and for the next portion of the clock cycle, switches S5 and S8 are opened and switches S6 and S7 are closed. As a result, for the one portion of each clock cycle, $V_{IN}$ is applied to integrator 20$a$ and $V_{INB}$ is applied to integrator 20$b$ and then for the next portion of each clock cycle, $V_{IN}$ is applied to integrator 20$b$ and $V_{INB}$ is applied to integrator 20$a$. As a result, the average outputs of integrator 20$a$ and integrator 20$b$ will be at, or close to, zero volts.

This is best explained with reference to FIGS. 2, 3 and 4. As already noted, control signal V1 and its complement control signal V1B are generated by network 300. Signal V1 is applied to a terminal 55 and signal V1B is applied to terminal 56. The signal V1 is coupled via capacitor C4 to node 61 and signal V1B is coupled via capacitor C3 to node 62. The amplitude of signals V1 and V1B and the values of capacitors C3 and C4 are selected to ensure that V1 and V1B will determine the value of signals at nodes 61 and 62 when the input signals e1 and e1$b$ are below a predetermined level. That is control signals V1 and V1B are selected such that for e1 and/or e1$b$ below a predetermined level, the signal voltage at node 61 will be more positive than the signal voltage at node 62 for one portion of a clock cycle and that the signal voltage at node 61 will be more negative than the signal voltage at node 62 for a like portion of the next subsequent clock cycle. This alternation of the signals generated at nodes 61 and 62 continues until e1 and/or e1$b$ is/are greater than a predetermined value.

The effect of V1 and V1B on the voltages e61 and e62 produced at nodes 61 and 62, respectively, is as follows.

For ease of description, refer to FIG. 4 starting at time t0 with CL1 low and CL2 high, which defines a compare phase. For this condition, switches S1, S2, S3 and S4 are open and switches S9 and S10 (and at some point, S11) are closed. The signal $V_{IN}$ is coupled via switch S9 to the input 53 of amplifier A1 which then produces a signal e1. Likewise, the signal $V_{INB}$ is coupled via switch S10 to the input 54 of A1 which then produces a corresponding output signal e1$b$.

During this time (t0 to t1), CL1 is low causing switches S1, S2, S3 and S4 to be open and V1 is low, and V1B is high. From time t0 to t1, the signal (e61) produced at node 61 and the signal e62 produced at node 62 may be expressed as follows:

$$e61 = e1 \times [c2/(c2+c4)] = es \qquad \text{Eq. 1a}$$

and $$e62 = e1b \times [c1/(c1+c3)] = esb \qquad \text{Eq. 1b}$$

At time t1 (during a compare phase and after the application of input signals), the signal V1 makes a transition from zero volts to VDD volts, producing a positive going signal at node 61 which is approximately equal to $(VDD) \times [c4/(c2+c4)]$. In a complementary manner, at time t1, the signal V1B makes a transition from VDD volts to zero volts producing a negative going signal at node 62 which is approximately equal to $(-VDD) \times [c3/(c1+c3)]$. The net signal at node 61 is equal to the contribution of e1 and V1 and the net signal at node 62 is equal to the contribution of e1b and V1B. The signals at nodes 61 and 62 may then be expressed as:

$$e61 = (e1)[c2/(c2+c4)] + VDD\,[c4/(c2+c4)] \qquad \text{eq. 2a}$$

and $$e62 = (e1b)[c1/(c1+c3)] - VDD\,[c3/(c1+c3)] \qquad \text{eq. 2b}$$

where the values of capacitors c1 and c2 are substantially equal to each other and the values of capacitors c3 and c4 are substantially equal to each other. Equations 1 and 2 may be rewritten as:

$$e61 = (e1)(kA) + VDD(kB) \qquad \text{eq. 3a}$$

and $$e62 = (e1b)(kA) - VDD(kB) \qquad \text{eq. 3b}$$

where:

kA = c2/(c2+c4) = c1/(c1+c3); and
 kB = c3/(c1+c3) = c4/(c2+c4).

Note that VDD, kA and kB are constant. Hence, equations 3a and 3b may be rewritten as follows:

$$e61 = es + Vc \qquad \text{eq. 4a}$$

and $$e62 = esb - Vc \qquad \text{eq. 4b}$$

where:

es = e1(kA); esb = e1b(kA); and
 Vc = VDD[c3/(c3+c4)] = VDD[c4/(c2+c4)]

Note:
 a) Vc represents a fixed potential which is periodically added to, and subtracted from, nodes 61 and 62; b) e1 may be positive or negative and that e1b is normally the inverse of e1; c) e61 will be positive for all values of es which are more positive than −Vc; and d) e62 will be negative for all values of esb which are not more positive than −Vc.

The signals e61 and e62 are compared by comparator A2 which produces a "high" signal e2 for the condition where e61 is more positive than e62. Thus, so long as e1 and/or e1b is, or are, below a predetermined level, e61 will be driven positive relative to e62 when V1 goes high and V1B goes low.

At time t2, S11 closes (S1, S2, S3 and S4 open) transferring the high e2 signal to the input of A3 producing a low at e3 and a high at e4. The signal e4 going high causes S5 and S8 to be turned on whereby $V_{IN}$ is coupled to integrator 20a and $V_{INB}$ is coupled to integrator 20b for a period lasting from t2 to t6 [one cycle of the clock CL1 or CL2].

From time t2 to t4, which defines an autozero phase, switches S1, S2, S3 and S4 are closed clamping the inputs of A1 and A2 to ground. During this period, S12 is closed and S11 is open whereby the latch (A3, A4) remains in the condition to which it was set at time t2.

At time t4, CL1 goes low and CL2 goes high closing switches S9 and S10 (and also S11), defining a new compare phase. The closing of S9 and S10 causes $V_{IN}$ and $V_{INB}$ to be applied to the inputs of amplifier A1 to produce corresponding output signals e1 and e1b. Signals e1 and e1b are then coupled via capacitors C2 and C1, respectively, to node 61 and 62 to produce signals which, as above, may be expressed as:

$$e61 = (e1)[c2/(c2+c4)] = es \qquad \text{eq. 1a}$$

and $$e62 = (e1b)[c1/(c1+c3)] = esb \qquad \text{eq. 1b}$$

When e1 and e1b are smaller than a predetermined level, they will cause the voltages at nodes 61 and 62 to vary about a reference level at those nodes. However, as discussed below, if they are less than a predetermined level, the control signals V1 and V1B, when applied, will override and mask the "input signals" e1 and e1b.

At time t5 (during a compare phase after the application of input signals), V1 makes a negative going transition from VDD to ground and V1B makes a positive going transition from ground to VDD. These transitions superimpose a negative going step voltage of $-(VDD)[c4/(c2+c4)]$ on node 61 and a positive going step voltage of $(VDD)[c3/(c1+c3)]$ on node 62. The voltages at nodes 61 and 62 may then be expressed as follows:

$$e61\; e1(kA) - VDD(kB) \qquad \text{eq. 5a}$$

and $$e62 = e1b(kA) + VDD(kB) \qquad \text{eq. 5b}$$

As discussed above, these equations may be expressed more simply as follows:

$$e61 = es - Vc \qquad \text{eq. 6a}$$

and $$e62 = esb + Vc \qquad \text{eq. 6b}$$

Referring to equations 6a and 6b, note that es and esb are normally the inverse of each other and may be positive or negative. So long as +Vc is more positive than −esb, e62 will be positive relative to the reference level and so long as the value of es is such that it is not greater than −Vc, e61 will be negative relative to the reference level. If these conditions exist, e62 will then be positive with respect to e61. This will cause e2 to go "low". The "low" at e2 is coupled via switch S11 to the input of A3 causing e3 to go high and e4 to go low.

Then, at time t6, switch S11 is opened and switch S12 is closed causing the e3 high and the e4 low conditions to be stored in the latch (A3, A4). With e3 high and e4 low, $V_{IN}$ is applied to integrator 20b and $V_{INB}$ is applied to integrator 20a from time t6 to t10 which is equal to one clock cycle of CL1 or CL2.

Thus, for values of e1 and e1b below a predetermined level, $V_{IN}$ is applied to integrator 20a and $V_{INB}$ is applied to integrator 20b for one clock cycle and then $V_{IN}$ is applied to integrator 20b and $V_{INB}$ is applied to integrator 20a for the next clock cycle. This procedure is repeated so long as e1 and e1b remain below predetermined levels.

In general, an examination of equations 4a and 4b and 6a and 6b and the waveforms of FIG. 4 reveals that for one transition of the control signals (e.g., V1 going positive and V1B going negative—which defines a first compare phase) a positive going voltage step is applied to node 61 and a negative going voltage step is applied to node 62. For the next transition of the control signals (e.g., V1 going negative and V1B going positive—defining the second compare phase) a negative going voltage step is applied to node 61 and a positive going voltage step is applied to node 62. This causes $V_{IN}$ and $V_{INB}$ to be alternatively applied to the integrators; e.g., During the odd numbered compare phases, $V_{IN}$ will be applied to integrator 20a and $V_{INB}$ will be applied to integrator 20b. During the even numbered compare phases, $V_{IN}$ will be applied to integrator 20b and $V_{INB}$ will be applied to integrator 20a. By alternately applying $V_{IN}$ and $V_{INB}$ to the integrators, it is evident that (except for some offset errors) the average outputs of integrators 20a and 20b should be at, or close to, zero.

One aspect of the invention is best understood by reviewing the operation of the circuit for the condition when the input signals ($V_{IN}$ and $V_{INB}$) are greater than a predetermined value and control the value (i.e., amplitude) of the signals applied to the inputs of comparator A2. That is, assume that the signals e1 and e1b produced at the outputs of amplifier A1 which are respectively coupled via capacitors C2 and C1 to the inputs of comparator amplifier A2 "override" or "mask" the effect of V1 and V1B coupled via C4 and C3. If, and when, $V_{IN}$ is more positive than $V_{INB}$, the output e2 of A2 is driven high and $V_{IN}$ which is positive relative to $V_{INB}$ is coupled to positive integrator 20a and $V_{INB}$ which is negative relative to $V_{IN}$ is coupled to negative integrator 20b. If, and when, $V_{IN}$ is negative relative to $V_{INB}$, the output e2 of A2 is driven low. For this condition, e3 will be high and cause $V_{IN}$ which is negative relative to $V_{INB}$ to be applied to integrator 20b and $V_{INB}$ which is positive relative to $V_{IN}$ to be applied to integrator 20a. Thus, when $V_{IN}$ and $V_{INB}$ are greater than a predetermined level, it is the relative amplitude of $V_{IN}$ and $V_{INB}$ which controls the closure of the rectifying switches to ensure that the more positive of the two input signals is always applied to the positive integrator circuit and the more negative of the two input signals is always applied to the negative integrator circuit. Thus, the signals produced at the outputs of integrators 20a and 20b increase as a function of time.

In accordance with the invention, whenever input signals $V_{IN}$ and $V_{INB}$ are below a predetermined level, the control signals V1 and V1B which may be described as square waves having a frequency f1 and a period T1 (where T1=1/f1) and which vary in amplitude between first and second levels override the "input signals" present at the inputs to the comparator. The control signals V1 and V1B cause the switches of the rectifier circuit to be opened and closed at a rate dependent on the frequency of the control signals. The switches of the rectifier circuit are then alternatively opened and closed for like (equal) periods of time as a function of the amplitude and frequency of the control signals. Thus, in accordance with the invention, the input signal $V_{IN}$ is applied to positive signal integrator 20a for a first period of time and to the negative signal integrator for a second period of time, subsequent to said first period, where the first and second periods are of like duration. Concurrently, $V_{INB}$ is applied to negative signal integrator 20b during the first period and to the positive signal integrator during the second period. The alternative application of $V_{IN}$ and $V_{INB}$ to integrators 20a and 20b results in the outputs of integrators 20a and 20b being equal to zero, on the average. That is, for small values of input signals (i.e., below the predetermined level), the input signals are applied to the integrators 20a and 20b such that the application of the input signals constitute a 50% duty cycle operation.

It has been shown that the comparator and amplifier circuit of FIG. 2 has alternate autozero and comparator phases. During the autozero phase, switches S1, S2, S3 and S4 are closed and switches S9 and S10 are open. During each comparator phase, switches S1, S2, S3 and S4 are open and switches S9 and S10 are closed. In addition, control signals (V1, V1B) are generated and applied to the comparator A2 during a portion of each compare phase, after the application of respective first and second input signals. If the input signals are greater than some predetermined level, they control the outputs of the comparator. On the other hand, if the input signals are below a predetermined level, set by the amplitude of the control signals, then the control signals determine the output conditions of the comparator.

Figure 5:
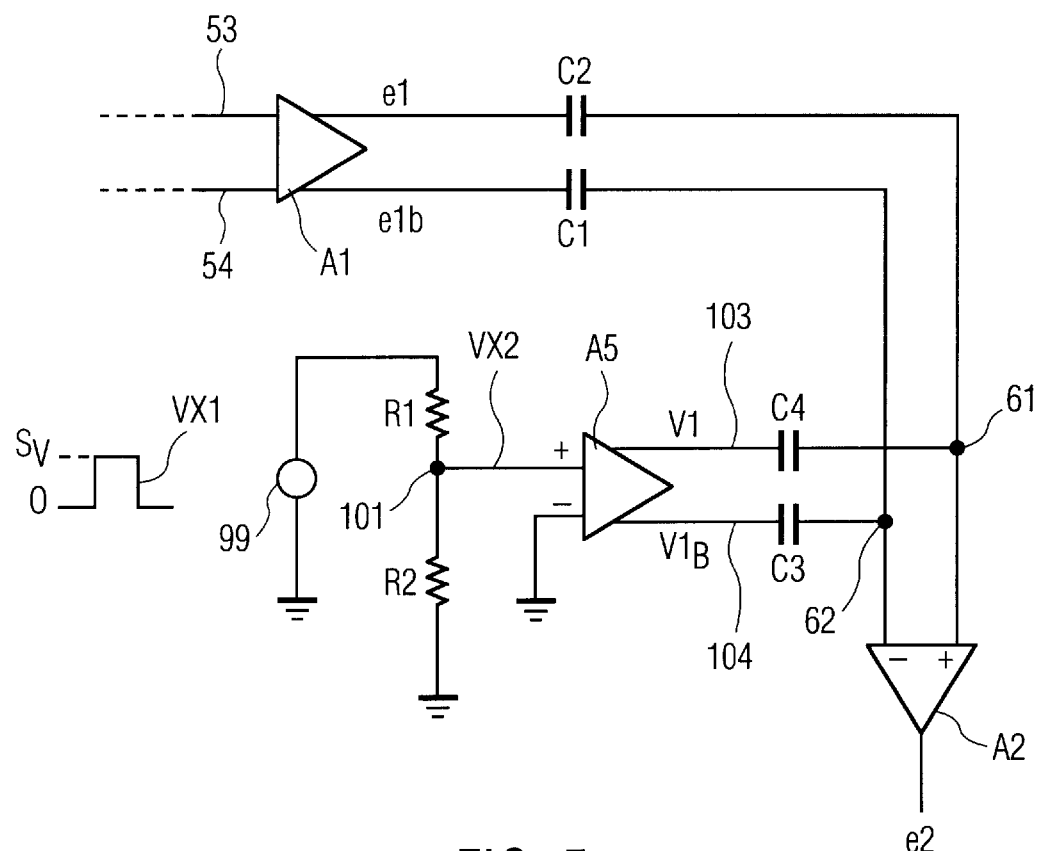
FIG. 5 is a more detailed schematic diagram of circuitry for applying control signals to a comparator, in accordance with the invention.

The generation of input signals e1 and e1b and their application via capacitors C1 and C2 to the inputs of comparator A2 is as shown in FIG. 2. The generation of V1 and V1B and the coupling of V1 and V1B with e1 and e1b, respectively, to the inputs of comparator A2 may be as shown in FIG. 5. A square wave generator 99 which may be part of a clock and control signal generating network, such as network 300, produces a square wave VX1 which is applied to a divider network (R1, R2) whose output, identified as node 101, is applied to the positive input of an amplifier A5. The negative input of amplifier A5 is grounded. Amplifier A5 is preferably made to be similar to A1, whereby A5 has very similar characteristics to, and a similar response as, A1. Amplifiers A1 and A5 may be any general purpose differential amplifier having a differential input and a differential output. Amplifier A5 has a first output 103 at which is produced a square wave signal V1 of fixed amplitude and frequency, and a second output 104 at which is produced a square wave signal V1B which is the complement (or inverse) of V1. V1 is coupled via capacitor C4 to the positive input of A2 and V1B is coupled via capacitor C3 to the negative input of amplifier A2. Where, for example, the amplitude of VX1 is 5 volts (i.e., VX1 varies between zero and 5 volts) and the gain of A5 (and A1) is 100 and it is desired to have a "dead" zone of approximately 5 millivolts, the following ratios may be used. Making R1=999R2 yields a VX2 equal to VX1/1,000, whereby VX2 varies between zero and 5 millivolts. If A5 has a gain of 100, V1 will vary between zero and 500 millivolts. By making C1=C2=99C4=99C3, the contribution of V1 to node 61 (and V1B to node 62) is equal to:

$$(500 \text{ mV})[c4/(c2+c4)] = (500 \text{ mV})[c4/(99c4+c4)] = 5 \text{ millivolts}.$$

What is claimed is:
1. A combination comprising:
a comparator having first and second inputs and an output, said comparator for producing a signal at said output having a first binary value when the signal applied to said first input is more positive than the signal applied to said second input and for producing a signal at said output having a second binary value when the signal applied to said second input is more positive than the signal applied to said first input;

means for applying a first input signal to said first input and for applying a second input signal to said second input; and means for applying a first control signal to said first input and a second control signal to said second input whereby the net signal at said first input is a function of said first input signal and said first control signal and the net signal at said second input is a function of said second input signal and said second control signal; wherein said first control signal alternates at a first rate between first and second levels and wherein said second control signal is the complement of said first control signal; and wherein the amplitude of the control signals is selected such that for values of input signals below a predetermined value, the control signals override the input signals and the output of the comparator varies as a function of the amplitude and rate of said first and second control signals.

2. A combination as claimed in claim 1 wherein said second input signal is designed to be the complement of said first input signal.

3. A combination as claimed in claim 2 wherein said first and second control signals are square waves of fixed amplitude.

4. A combination as claimed in claim 3 wherein said first input signal is coupled via a first capacitor to the first input of said comparator, where said second input signal is coupled via a second capacitor to the second input of said comparator, wherein said first control signal is coupled via a third capacitor to the first input of said comparator, and wherein said second control signal is coupled via a fourth capacitor to the second input of said comparator.

5. A combination as claimed in claim 4 wherein said first capacitor is equal to said second capacitor and wherein said third capacitor is equal to said fourth capacitor.

6. A combination as claimed in claim 5 wherein said control signals function to apply a negative voltage step to one input of said comparator and a positive voltage step to the other input of said comparator for one transition of the control signals and function to apply a positive voltage step to the one input of said comparator and a negative voltage step to the other input of said comparator for the next opposite going transition of the control signals.

7. A combination as claimed in claim 6 wherein the control signal applied to a comparator input adds to, or subtracts from, the value of the input signal at the comparator input a fixed predetermined voltage step.

8. A combination as claimed in claim 6 further including a first selectively enabled switch connected between said first input of said comparator and a point of reference potential; and a second selectively enabled switch connected between said second input of said comparator and said point of reference potential.

9. A combination as claimed in claim 8 wherein said first and second selectively enabled switches are periodically enabled to clamp the inputs of said comparator to said reference potential, and are periodically disabled; and wherein, when said first and second selectively enabled switches are disabled, means are provided for applying input signals to said first and second capacitors and means are provided for applying said first and second control signals to said third and fourth capacitors, respectively.

10. A combination as claimed in claim 7 further including:

a latch circuit having an input coupled to said comparator output and having an output at which are produced binary signals;

a first positive signal, integrator and a second, negative signal, integrator; and a rectifier network including switches which are connected to the output of the latch and responsive to its binary signals for coupling the first input signal to said first integrator and the second input signal to the second integrator for one condition of the latch and for coupling the first input signal to the second integrator and the second input signal to the first integrator for another condition of the latch.

11. A combination as claimed in claim 10 wherein said rectifier network includes, a first selectively enabled switch means coupled to said positive signal integrator for selectively coupling the first input signal thereto;

a second selectively enabled switch means coupled to said positive signal integrator for selectively coupling the second input signal thereto;

a third selectively enabled switch means coupled to said negative signal integrator for selectively coupling the first input signal thereto; and a fourth selectively enabled switch, means coupled to said negative signal integrator for selectively coupling the second input signal thereto.

12. A combination comprising:

a comparator having first and second inputs and an output, said comparator for producing a signal at said output having a first binary value when the signal applied to said first input is more positive than the signal applied to said second input and for producing a signal at said output having a second binary value when the signal applied to said second input is more positive than the signal applied to said first input;

first and second input terminals for the application thereto of first and second input signals, respectively;

a first capacitor connected between said first input terminal and said first comparator input;

a second capacitor connected between said second input terminal and said second comparator input;

a third input terminal for the application thereto of a first control signal;

a fourth input terminal for the application thereto of a second control signal which is the inverse of the first control signal;

a third capacitor connected between said third input terminal and said first comparator input; and a fourth capacitor connected between said fourth input terminal and said second comparator input.

13. A combination as claimed in claim 12, further including:

first and second switches respectively coupled between said first and second comparator inputs and a reference potential for selectively clamping said first and second comparator inputs to said reference potential.

14. A combination as claimed in claim 13, wherein said first and second switches are turned on and off at a first rate, and wherein the first and second control signals switch between first and second levels and vary at a second rate which is one half the first rate.

15. A combination as claimed in claim 14 wherein the leading edge and falling edge of the control signals occur when the first and second switches are turned off, whereby the first control signal causes a first signal to be produced at the first input of the comparator which is a function of its amplitude and direction and the ratio of the first and third capacitors and whereby the second control signal causes a second signal to be produced at the second input of the comparator which is the complement of the first signal and which is also a function of the second and fourth capacitors.

16. A combination as claimed in claim 12, wherein said second input signal is normally the complement of said first input signal.

17. A combination as claimed in claim 16, wherein said first capacitor has the same value as said second capacitor.

18. A combination as claimed in claim 17 wherein said third capacitor has the same value as said fourth capacitor; and wherein the first and second capacitors are greater than the third and fourth capacitors.

19. A combination as claimed in claim 18, wherein said first and second control signals are square waves which vary in amplitude between first and second fixed levels, and each control signal produces a fixed negative step voltage at its corresponding comparator input when it makes a negative transition and a fixed positive step voltage at its corresponding comparator input when it makes a positive transition.

20. A combination comprising:

a comparator having first and second inputs and an output, said comparator for producing a signal at said output having a first binary value when the signal applied to said first input is more positive than the signal applied to said second input and for producing a signal at said output having a second binary value when the signal applied to said second input is more positive than the signal applied to said first input;

first and second input terminals for the application thereto of first and second input signals, respectively;

means coupling said first input terminal to said first comparator input and said second input terminal to said second comparator input;

third and fourth input terminals;

a first capacitor connected between said third input terminal and said first comparator input and a second capacitor connected between said fourth input terminal and said second comparator input; and means for applying a first control signal to said third input terminal and the complement of said first control signal to said fourth input terminal; wherein said first control signal and its complement are square waves which vary in amplitude between a first fixed level and a second fixed level.

21. A comparator circuit having first and second inputs and an output and including means for operating the comparator in alternate autozero and comparator phases wherein during an autozero phase the inputs of the comparator are clamped to a reference potential and, during a compare phase, input signals are applied to the input of the comparator, the improvement comprising:

means for generating control signals and applying the control signals to the inputs of the comparator during a portion of the compare phase, said control signals determining the state of the comparator output when the input signals applied to the input of the comparator are below a predetermined level.

* * * * *